(12) United States Patent
Chen et al.

(10) Patent No.: US 12,538,849 B2
(45) Date of Patent: Jan. 27, 2026

(54) POWER SEMICONDUCTOR DEVICE AND POWER CONVERSION DEVICE

(71) Applicant: HITACHI, LTD., Tokyo (JP)

(72) Inventors: Ti Chen, Tokyo (JP); Akihiro Namba, Tokyo (JP); Takeshi Tokuyama, Tokyo (JP); Takahiro Araki, Tokyo (JP); Kyota Asai, Tokyo (JP)

(73) Assignee: HITACHI, LTD., Tokyo (JP)

( * ) Notice: Subject to any disclaimer, the term of this patent is extended or adjusted under 35 U.S.C. 154(b) by 388 days.

(21) Appl. No.: 18/276,097

(22) PCT Filed: Mar. 8, 2022

(86) PCT No.: PCT/JP2022/010051
§ 371 (c)(1),
(2) Date: Aug. 7, 2023

(87) PCT Pub. No.: WO2022/202292
PCT Pub. Date: Sep. 29, 2022

(65) Prior Publication Data
US 2024/0105693 A1   Mar. 28, 2024

(30) Foreign Application Priority Data
Mar. 24, 2021   (JP) .................................. 2021-049835

(51) Int. Cl.
*H01L 25/16*   (2023.01)
*H01L 23/00*   (2006.01)
(Continued)

(52) U.S. Cl.
CPC .............. *H01L 25/16* (2013.01); *H01L 23/13* (2013.01); *H01L 23/49838* (2013.01);
(Continued)

(58) Field of Classification Search
None
See application file for complete search history.

(56) References Cited

U.S. PATENT DOCUMENTS

2024/0040702 A1* 2/2024 Tokuyama ............ H01L 25/072

FOREIGN PATENT DOCUMENTS

JP   2018-142620 A   9/2018

OTHER PUBLICATIONS

International Search Report of PCT/JP2022/010051 dated May 31, 2022.

* cited by examiner

*Primary Examiner* — Sue A Purvis
*Assistant Examiner* — Jordan M Klein
(74) *Attorney, Agent, or Firm* — MATTINGLY & MALUR, PC

(57) ABSTRACT

A power semiconductor device according to the present invention is provided with: a first circuit body constituting an upper arm of an inverter circuit for converting a DC current into an AC current; a second circuit body constituting a lower arm of the inverter circuit; and a circuit board that has therein a through-hole in which the first circuit body and the second circuit body are disposed and that has an intermediate board between the first circuit body and the second circuit body. The intermediate board has an AC wiring pattern for transmitting the AC current, and the first circuit body and the second circuit body are connected to the AC wiring pattern so as to be in surface contact with the AC wiring pattern.

9 Claims, 7 Drawing Sheets

(51) Int. Cl.
*H01L 23/13* (2006.01)
*H01L 23/495* (2006.01)
*H01L 23/498* (2006.01)

(52) U.S. Cl.
CPC .. *H01L 23/49537* (2013.01); *H01L 23/49575* (2013.01); *H01L 24/32* (2013.01); *H01L 24/40* (2013.01); *H01L 24/48* (2013.01); *H01L 24/73* (2013.01); *H01L 2224/32245* (2013.01); *H01L 2224/40225* (2013.01); *H01L 2224/48227* (2013.01); *H01L 2224/73221* (2013.01); *H01L 2224/73263* (2013.01); *H01L 2924/1203* (2013.01); *H01L 2924/13055* (2013.01)

POWER SEMICONDUCTOR DEVICE AND POWER CONVERSION DEVICE

TECHNICAL FIELD

The present invention relates to a power semiconductor device and a power conversion device.

BACKGROUND ART

A power conversion device that performs power conversion by a switching operation of a power semiconductor device has high conversion efficiency. Accordingly, the power conversion device has been widely used for a consumer use, an in-vehicle use, a railway use, transformation equipment, and the like. In this power semiconductor device, a large current flows when a switching operation is performed and hence, a current path with a low current loss is required. For example, a power semiconductor device for in-vehicle use is required to satisfy the downsizing and the reduction of a current loss.

Patent Literature 1 discloses a power semiconductor device where, in a circuit body having a power semiconductor element, an upper arm side IGBT, an upper arm side diode, a lower arm side IGBT, and a lower arm side diode that are power semiconductor elements are connected to a collector-side lead frame by soldering.

CITATION LIST

Patent Literature

PTL 1: JP 2018-142620 A

SUMMARY OF INVENTION

Technical Problem

The device described in Patent Literature 1 has problems with respect to the downsizing and the reduction of a current loss of the device.

Solution to Problem

A power semiconductor device according to the present invention includes: a first circuit body constituting an upper arm of an inverter circuit for converting a DC current to an AC current; a second circuit body constituting a lower arm of the inverter circuit; and a circuit board that has a through hole in which the first circuit body and the second circuit body are disposed, and has an intermediate board between the first circuit body and the second circuit body, wherein the intermediate board has an AC wiring pattern for transmitting the AC current, and the first circuit body and the second circuit body are connected to the AC wiring pattern in a state where the first circuit body and the second circuit body are in face contact with the AC wiring pattern.

Advantageous Effects of Invention

According to the present invention, it is possible to realize the downsizing and the reduction of a current loss of a power semiconductor device.

DESCRIPTION OF EMBODIMENTS

Figure 1:
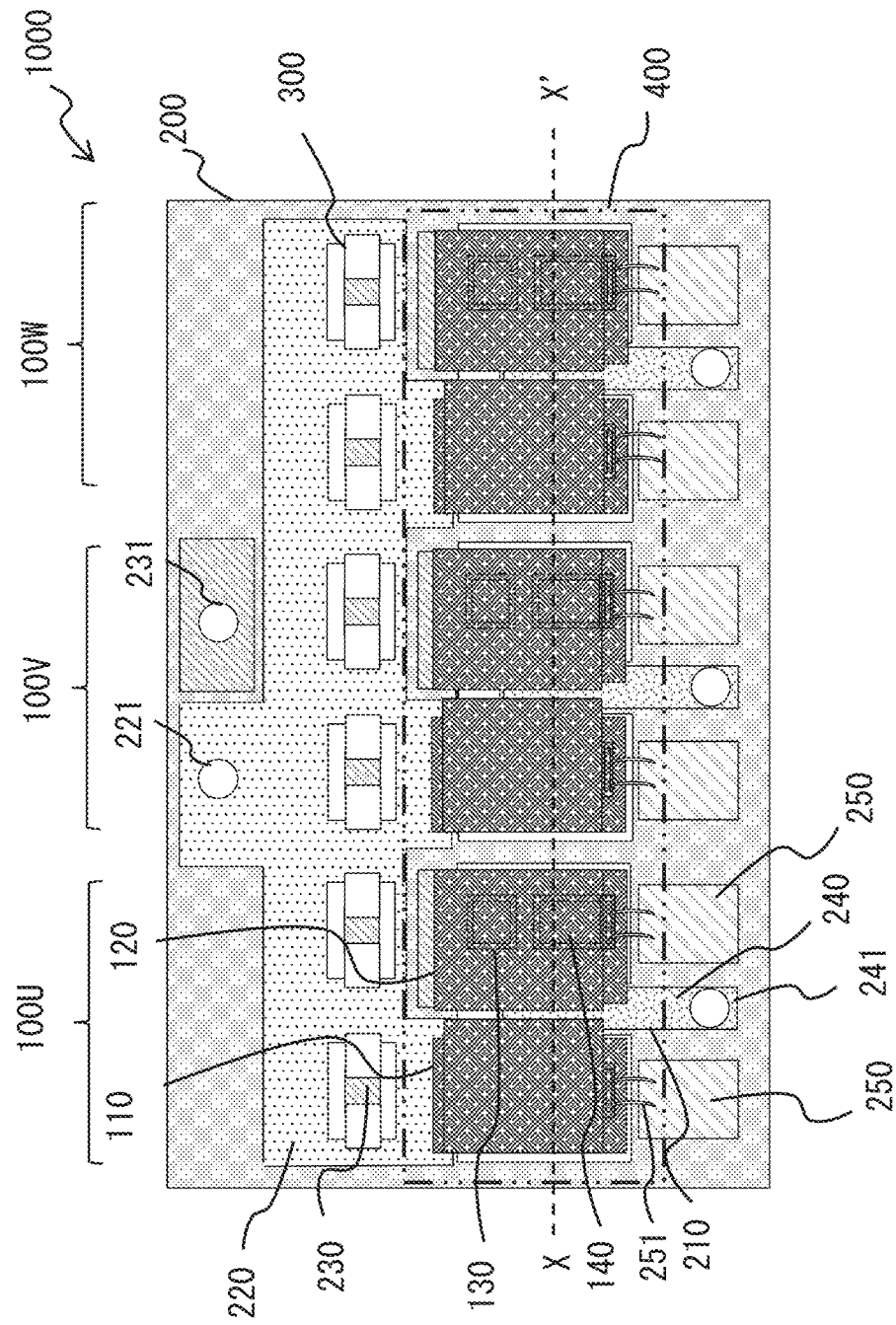
FIG. 1 is a top plan view of a power conversion device.

Hereinafter, embodiments of the present invention will be described with reference to the drawings. The following description and drawings are provided for an exemplifying purpose to describe the present invention. Accordingly, the description and drawings are partially omitted and and are simplified when appropriate for the sake of clarity of the description. The present invention can be carried out in various other modes. Unless otherwise specified, each component may be used either as a single component or as a plurality of components.

There may be cases where positions, sizes, shapes, ranges, and the like of the respective constitutional elements illustrated in the drawings do not represent actual positions, sizes, shapes, ranges, and the like in order to facilitate the understanding of the present invention. Therefore, the present invention is not necessarily limited to the positions, the sizes, the shapes, the ranges, and the like of the respective constitutional elements disclosed in the drawings.

When there exist a plurality of constitutional elements having the same functions or substantially the same functions, there may cases where the description is made by attaching the same reference numerals to these constitutional elements while adding different subscripts to these constitutional elements. However, in a case where it is not necessary to distinguish the plurality of constitutional elements from each other, there may be cases where the description of the constitutional elements is made while omitting the subscripts.

FIG. 1 is a top plan view of a power conversion device 1000 that is formed of power semiconductor devices 100.

The power semiconductor device 100 includes: a first circuit body 110 constituting an upper arm of an inverter circuit that is described later; and a second circuit body 120 constituting a lower arm of the inverter circuit.

The power conversion device 1000 is configured by arranging a U-phase power semiconductor device 100U, a V-phase power semiconductor device 100V, and a W-phase power semiconductor device 100W in parallel with each other on a circuit board 200. The power semiconductor devices 100U, 100V, and 100W have substantially the same chip configuration. Accordingly, in the description made hereinafter, there may be cases where these power semiconductor devices 100U, 100V, and 100W are simply referred to as the power semiconductor device 100.

A through hole is formed in the circuit board 200 in a state where the first circuit body 110 and the second circuit body 120 are disposed in the through hole in a penetrating manner between an upper surface and a lower surface of the circuit board 200. The circuit board 200 has an intermediate board 210 that is disposed between the first circuit body 110 and the second circuit body 120. The detail of the through hole will be described later.

On one side (an upper side in the drawing) of the circuit board 200, a positive DC wiring pattern 220 and a negative DC wiring pattern 230 are stacked in a state where the positive DC wiring pattern 220 and the negative DC wiring pattern 230 are insulated from each other. The positive DC wiring pattern 220 is connected to a positive terminal 221, and the negative DC wiring pattern 230 is connected to a negative terminal 231.

On the other side (a lower side in the drawing) of the circuit board 200, AC wiring patterns 240 for transmitting an AC current to intermediate boards 210 of the circuit board 200 are formed. Control wiring patterns for transmitting control signals to gate electrode of transistors 140 in each of the circuit bodies 110 and 120 via lead wires 251 are formed in control wiring pattern areas 250. The AC wiring patterns 240 are connected to the AC terminals 241, and the control wiring pattern areas 250 are connected to control terminals (not illustrated).

The first circuit body 110 and the second circuit body 120 each include a diode 130 and a transistor 140. The DC wiring patterns 220 and 230, diodes 130, the transistors 140, and the control wiring pattern areas 250 are disposed in this order from one side to the other side on the surface of the circuit board 200. The transistor 140 is, for example, an IGBT.

Circuit components 300 such as capacitors are mounted on the circuit board 200. The capacitor is, for example, a film capacitor, a ceramic capacitor, or the like. Other electronic components other than the capacitors may be mounted on the circuit board 200. The circuit components 300 may be disposed on the DC wiring patterns 220 and 230 side, or may be disposed on the AC wiring pattern 240 side.

Wither respect to the power semiconductor devices 100 for three phases that are disposed parallel to each other on the circuit board 200, the first circuit body 110 and the second circuit body 120 of each power semiconductor device 100 are sealed by a sealing member 400. In FIG. 1, the sealing member 400 is illustrated in a see-through state so as to clearly illustrate the internal configuration of the semiconductor converter device 100. The sealing member 400 is made of a resin material or the like having insulating property. The sealing member 400 covers the entirety of the first circuit bodies 110 and the second circuit bodies 120, the DC wiring patterns 220 and 230, the AC wiring patterns 240, and portions of the control wiring pattern area 250. The sealing member 400 is formed on and below the circuit board 200. The sealing member 400 may be formed in a state where the sealing member 400 covers the circuit components 300.

Figure 2:
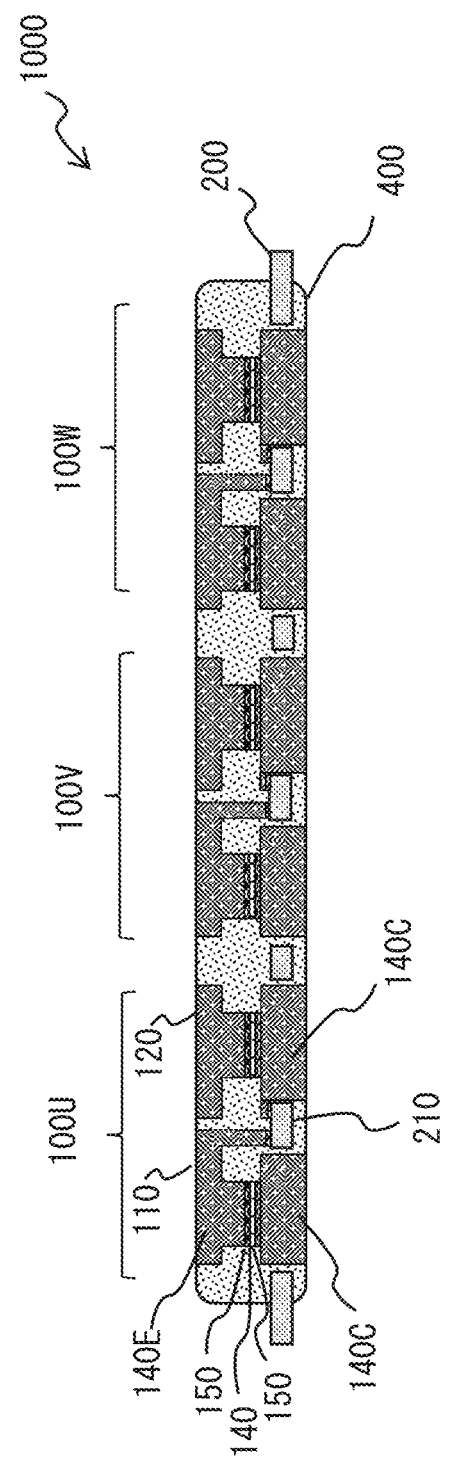
FIG. 2 is a cross-sectional view of a power conversion device.

FIG. 2 is a cross-sectional view of the power conversion device 1000. FIG. 2 illustrates a cross section taken along a line X-X' in FIG. 1.

An emitter of the transistor 140 is joined to an emitter-side lead frame 140E by a solder 150. A collector of the transistor 140 is joined to a collector-side lead frame 140C by a solder 150. On one surface of the circuit board 200, the emitter sides of the first circuit bodies 110 and the emitter sides of the second circuit bodies 120 of the power semiconductor devices 100 for three phases are disposed. On the other surface of the circuit board 200, the collector sides of the first circuit bodies 110 and the collector sides of the second circuit bodies 120 of the power semiconductor devices 100 for three phases are disposed. With such configurations, chips of the respective the transistors 140 face the same surface and hence, manufacturing steps can be simplified.

The emitter-side lead frame 140E of the first circuit body 110 is connected with the AC wiring pattern 240 of the intermediate board 210 in a state where the emitter-side lead frame 140E is in face contact with the AC wiring pattern 240. The collector-side lead frame 140C of the second circuit body 120 is connected with the AC wiring pattern 240 of the intermediate board 210 in a state where the collector-side lead frame 140C is in face contact with the AC wiring pattern 240.

In the power conversion device 1000, the circuit board 200 is sandwiched between the emitter sides of the first circuit bodies 110 and the second circuit bodies 120 and the collector sides of the first circuit bodies 110 and the second circuit bodies 120. Cooling devices (not illustrated in the drawings) are disposed in contact with the emitter sides of the first circuit bodies 110 and the second circuit bodies 120 and the collector sides of the first circuit bodies 110 and the second circuit bodies 120 by way of insulation members respectively. Through holes are formed in the circuit board 200 so as to expose the first circuit bodies 110 and the second circuit bodies 120 to both surfaces of the circuit board 200. Accordingly, the cooling devices can cool the power semiconductor devices 100 from both surfaces. With respect to the intermediate board 210 on which the respective lead frames 140E and 140C and the AC wiring pattern 240 are connected to each other in a state where respective lead frames 140E and 140C and the alternating-current wiring pattern 240 are in face contact with each other, the intermediate board 210 is located below the cooling devices. Accordingly, the AC wiring pattern 240 that generates a large amount of heat can be efficiently cooled.

Figure 3:
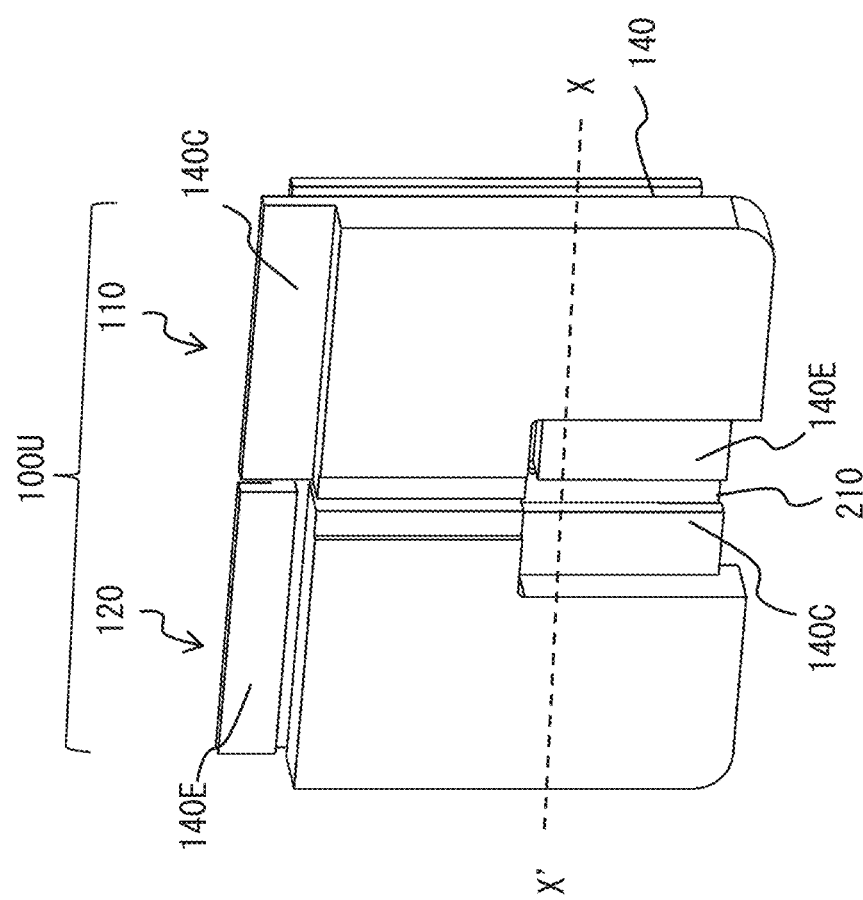
FIG. 3 is a perspective view of a main part of the power semiconductor device.

FIG. 3 is a perspective view of a main part of the power semiconductor device 100U.

As described above, the emitter-side lead frame 140E of the first circuit body 110 is connected with the AC wiring pattern 240 of the intermediate board 210 in a state where the emitter-side lead frame 140E is in face contact with the AC wiring pattern 240. The collector-side lead frame 140C of the second circuit body 120 is connected with the AC wiring pattern 240 of the intermediate board 210 in a state where the collector-side lead frame 140C is in face contact with the AC wiring pattern 240. Since the respective lead frames 140E and 140C and the AC wiring pattern 240 are in face contact with each other on the intermediate board 210 and hence, a contact area is secured whereby a loss of a flowing current can be reduced. Further, a current path that is connected between the emitter side of the first circuit body 110 and the collector side of the second circuit body 120 can be downsized and hence, the current loss can be reduced, and the device can be downsized. Still further, a current path that is connected between the emitter side of the first circuit body 110 and the collector side of the second circuit body 120 is also minimized and hence, the inductance can be reduced whereby a surge voltage at the time of high-speed switching can be reduced. Further, the emitter-side lead frame 140E of the first circuit body 110 and the collector-side lead frame 140C of the second circuit body 120 are connected with the AC wiring pattern 240 in face contact. Accordingly, the connection step can be stably performed in the manufacturing process, and the configuration of the device can be strengthened after manufacturing.

The collector-side lead frame 140C of the first circuit body 110 has a region that is connected with the positive DC wiring pattern 220 in a state where the region is in face contact with the positive DC wiring pattern 220. The emitter-side lead frame 140E of the second circuit body 120 has a region that is connected with the negative DC wiring pattern 230 in a state where the region is in face contact with the negative DC wiring pattern 230. Therefore, the collector-side lead frame 140C and the emitter-side lead frame 140E can respectively secure contact areas with the DC wiring patterns 220 and 230 and hence, a current loss can be reduced. Further, a current path can be also minimized and hence, a current loss can be reduced, and the downsizing of the device can be realized. Further, the emitter-side lead frame 140E of the first circuit body 110 and the collector-side lead frame 140C of the second circuit body 120 are connected with the AC wiring pattern 240 in face contact. Accordingly, the connection step can be stably performed in the manufacturing process, and the configuration of the device can be strengthened after manufacturing.

As illustrated in FIG. 3, in the power semiconductor device 100, the first circuit body 110 and the second circuit body 120 are connected with the DC wiring patterns 220 and 230 and the AC wiring pattern 240 of the circuit board 200 in a state where the first circuit body 110 and the second circuit body 120 are in face contact with the DC wiring patterns 220 and 230 and the AC patterns 240 of the circuit board 200. Then, as illustrated in FIG. 2, through holes are formed in the circuit board 200, and the first circuit body 110 and the second circuit body 120 are disposed in each of the through holes formed in the circuit board 200 so as to constitute the power semiconductor devices 100 for three phases. The power conversion device 1000 configured as described above can realize the reduction of a thickness, the downsizing and a low current loss.

Figure 4:
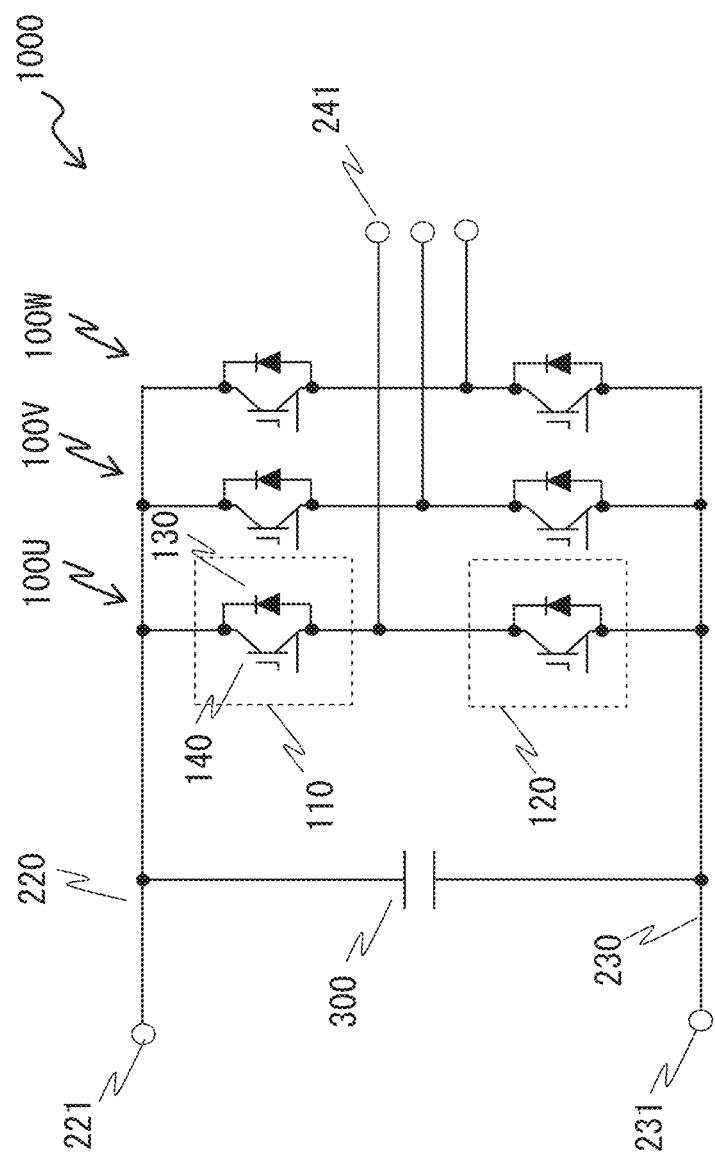
FIG. 4 is a circuit configuration diagram of the power semiconductor device.

FIG. 4 is a circuit configuration diagram of the power semiconductor device 100.

In the power conversion device 1000, an inverter circuit is formed by the U-phase power semiconductor device 100U, the V-phase power semiconductor device 100V, and the W-phase power semiconductor device 100W.

Each power semiconductor device 100 includes: the first circuit body 110 constituting an upper arm of the inverter circuit; and the second circuit body 120 constituting a lower arm of the inverter circuit. The first circuit body 110 and the second circuit body 120 each include the diode 130 and the transistor 140.

A smoothing capacitor that is a circuit component 300 is connected between the DC wiring pattern 220 that is connected to the positive terminal 221 and the DC wiring pattern 230 that is connected to the negative terminal 231. A DC power supply such as a battery (not illustrated in the drawings) is connected between the positive terminal 221 and the negative terminal 231. The inverter circuit converts an input DC power into an AC power, and outputs a three-phase AC current to an AC terminal 241. As described above, the emitter side of the first circuit body 110 and the collector side of the second circuit body 120 are connected with the AC wiring pattern 240 of the intermediate board 210 in a state where the emitter side of the first circuit body 110 and the collector side of the second circuit body 120 are in face contact with the alternating-current wiring pattern 240 of the intermediate board 210. Accordingly, contact areas between the emitter side of the first circuit body 110 and the collector side of the second circuit body 120 and the alternating-current wiring pattern 240 of the intermediate board 210 are secured, and a loss of a flowing current can be reduced. Further, a current path that is connected between the emitter side of the first circuit body 110 and the collector side of the second circuit body 120 can be minimized.

Figure 5:
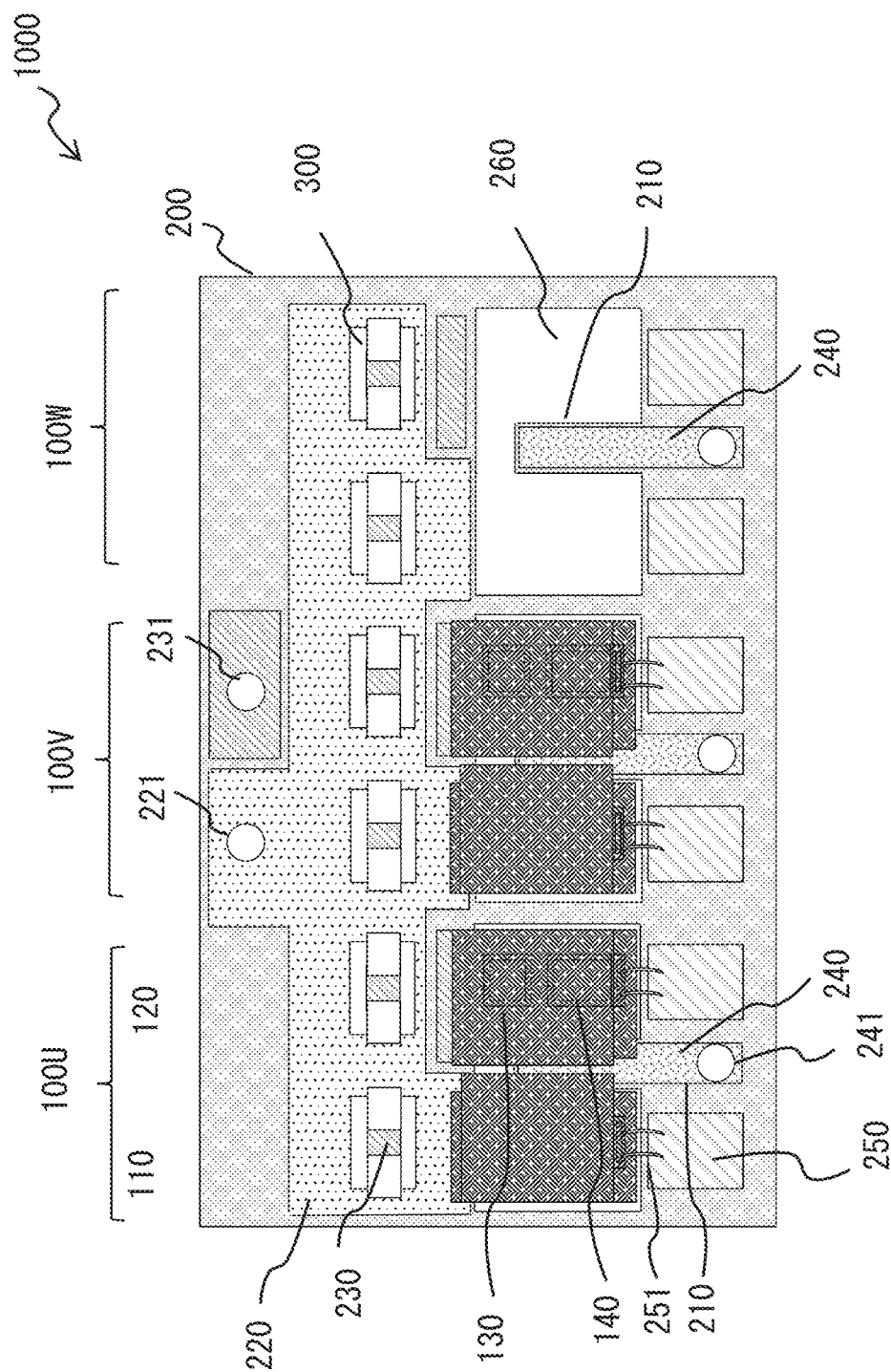
FIG. 5 is a top plan view of the circuit board.

FIG. 5 is a top view of the circuit board 200 of the power conversion device 1000.

The circuit board 200 differs from the circuit board 200 illustrated in FIG. 1 with respect to a point that the first circuit body 110 and the second circuit body 120 in the W phase are removed. Other configurations are the same as the corresponding configurations illustrated in FIG. 1, and the identical portions are denoted by the same reference numerals, and the description of the portions will be omitted.

The power conversion device 1000 illustrated in FIG. 5 has the same configuration as the power conversion device 1000 illustrated in FIG. 1. On the other hand, FIG. 5 is a diagram provided for describing a through hole 260 formed in the circuit board 200. The through hole 260 is formed to allow the first circuit body 110 and the second circuit body 120 to be disposed in the through hole 260 in a state where the first circuit body 110 and the second circuit body 120 penetrate the circuit board 200 from the upper surface to the lower surface of the circuit board 200. In this embodiment, with respect to the through hole 260, the hole in which the first circuit body 110 is disposed and the hole in which the second circuit body 120 is disposed communicate with each other, and the intermediate board 210 is formed in a middle portion between two holes. The intermediate board 210 extends to a position in the vicinity of the circuit board 200 where the DC wiring patterns 220 and 230 are disposed. As a result, as described above, the emitter-side lead frame 140E of the first circuit body 110 and the collector-side lead frame 140C of the second circuit body 120 can be connected with the AC wiring pattern 240 of the intermediate board 210 in a state where the emitter-side lead frame 140E and the collector-side lead frame 140C are in face contact with the alternating-current wiring pattern 240. In FIG. 5, the through hole 260 formed in the W-phase of the circuit board 200 has been described as an example. However, the U-phase and the V-phase have substantially the same configuration.

Figure 6:
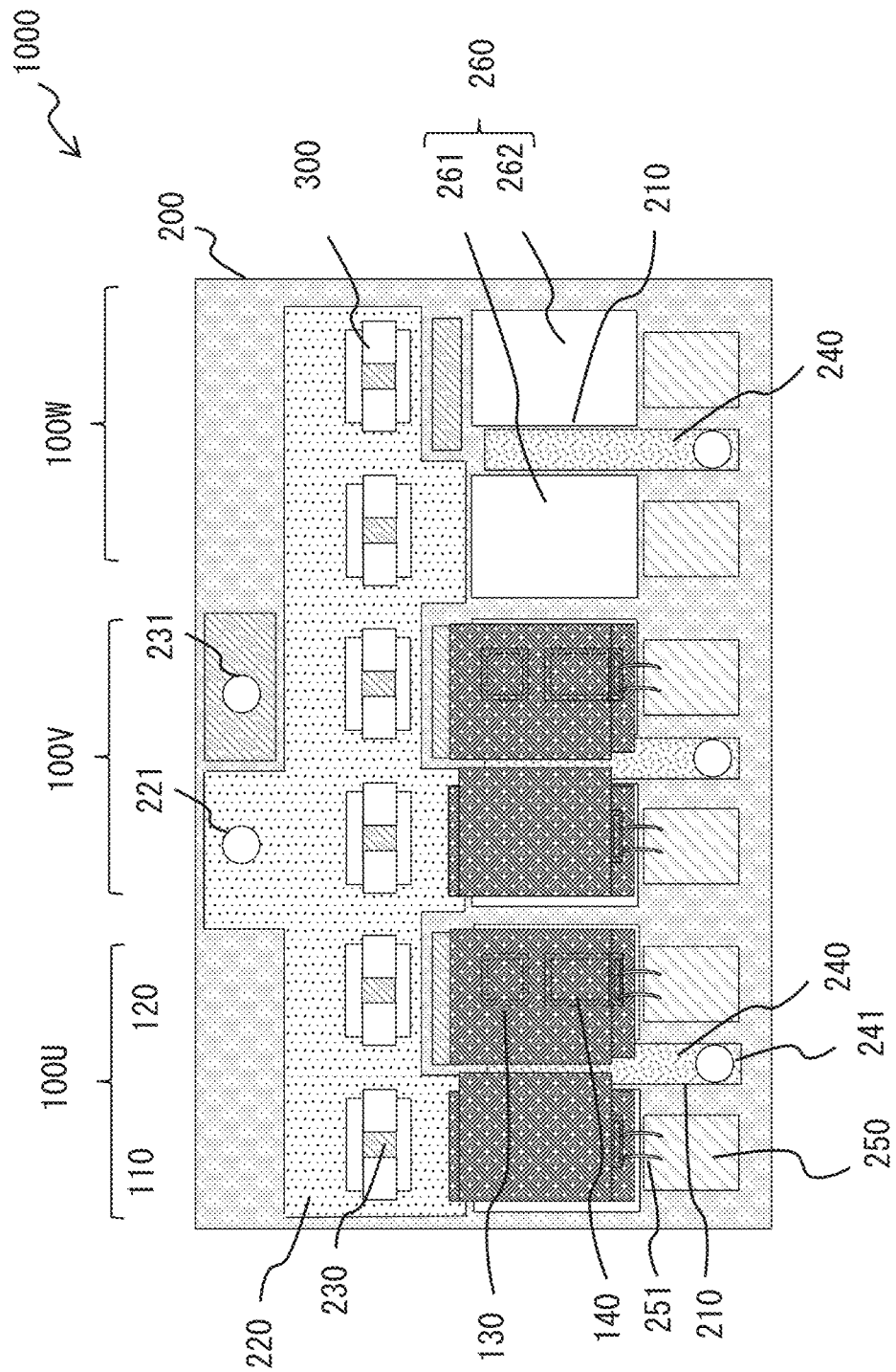
FIG. 6 is a top plan view illustrating a first modification of a through hole formed in the circuit board.

FIG. 6 is a top plan view illustrating a first modification of the through hole 260 formed in the circuit board 200.

The circuit board 200 differs from the circuit board 200 illustrated in FIG. 1 with respect to a point that the first circuit body 110 and the second circuit body 120 in the W-phase are removed from the circuit board 200. Other configurations are the same as the corresponding configurations illustrated in FIG. 1, and the identical portions are denoted by the same reference numerals, and the description of the portions will be omitted.

In FIG. 5, an example is illustrated where the intermediate board 210 extends to the position in the vicinity of the circuit board 200 on which the DC wiring patterns 220 and 230 are disposed. However, in the first modification illustrated in FIG. 6, the intermediate board 210 is connected to the circuit board 200 on which the DC wiring patterns 220 and 230 are disposed. In other words, in the through hole 260, a first through hole 261 in which the first circuit body 110 is disposed and a second through hole 262 in which the second circuit body 120 is disposed are independently from each other, and the intermediate board 210 having the AC wiring pattern is disposed between the first through hole 26 and the second through hole 262. The configuration of the first modification also acquires substantially the same advantageous effects described above.

Figure 7:
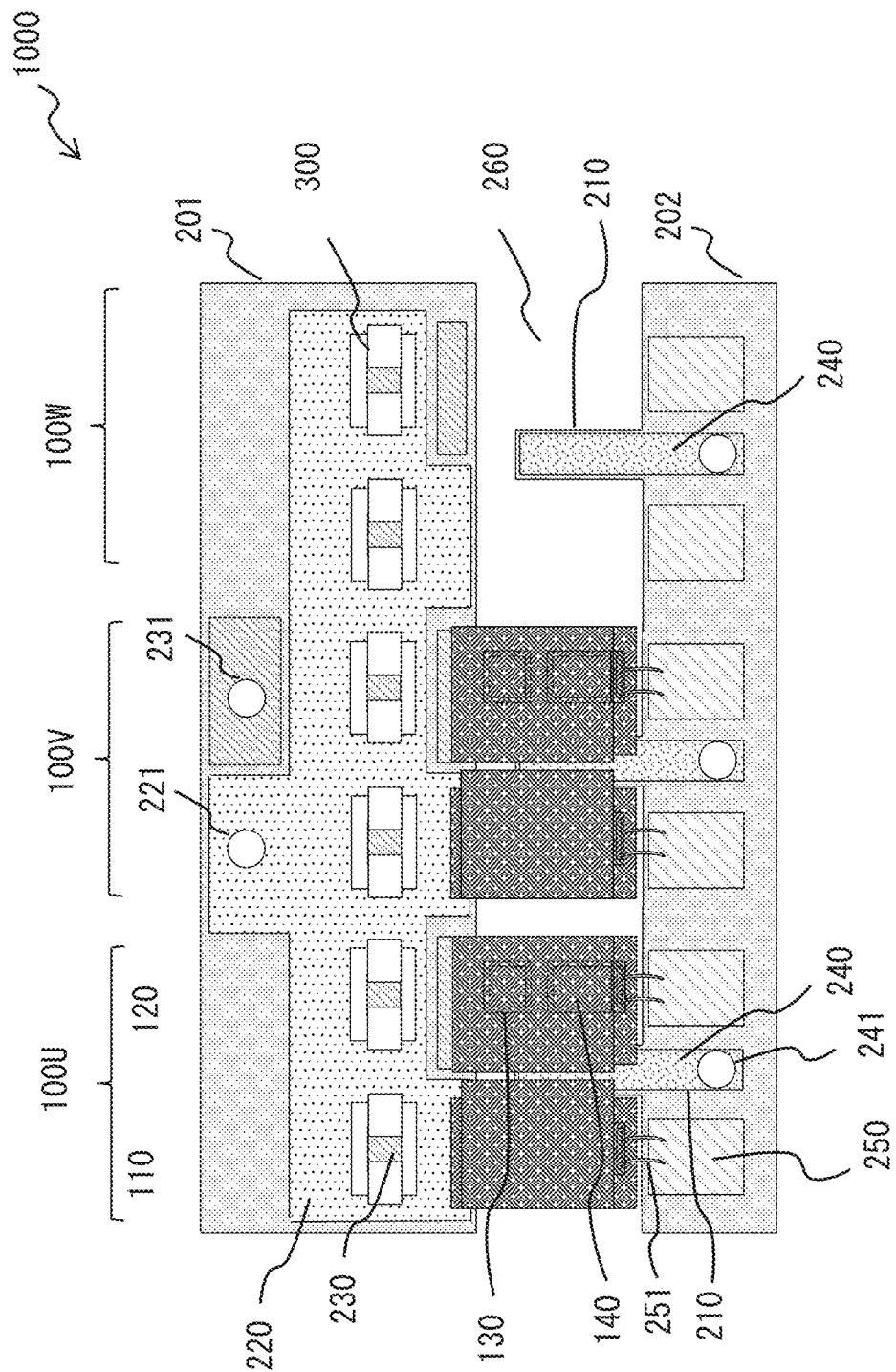
FIG. 7 is a top plan view illustrating a second modification of the through hole formed in the circuit board.

FIG. 7 is a top plan view illustrating a second modification of the through hole 260 formed in the circuit board 200.

The circuit board 200 differs from the circuit board 200 illustrated in FIG. 1 with respect to a point that the first circuit body 110 and the second circuit body 120 in the W-phase are removed from the circuit board 200. Other configurations are the same as the corresponding configurations illustrated in FIG. 1, and the identical portions are denoted by the same reference numerals, and the description of the portions will be omitted.

As illustrated in FIG. 7, the circuit board 200 is separated into a first circuit board 201 and a second circuit board 202. That is, in the circuit board 200, the first circuit board 201 on which the DC wiring patterns 220 and 230 and the circuit components 300 are disposed and the second circuit board 202 on which the AC wiring patterns 240 and the control wiring pattern areas 250 of the first circuit bodies 110 and the second circuit bodies 120 are disposed are formed separately from each other. The intermediate boards 210 are integrally formed with the second circuit board 202, and extend to a position near the first circuit board 201 on which the DC wiring patterns 220 and 230 are disposed. The through hole 260 is formed between the first circuit board 201 and the second circuit board 202.

The configuration of the second modification also can acquire substantially the same advantageous effects as described above. Further, in addition to the above-mentioned advantageous effects, the configuration of the second modification can reduce a cost of a material of the circuit board 200 and can improve the productivity of the circuit board 200.

According to the embodiments described above, the following manners of operation and advantageous effects can be obtained.

(1) The power semiconductor device 100 includes: the first circuit body 110 constituting the upper arm of the inverter circuit for converting a DC current to an AC current; the second circuit body 120 constituting a lower arm of the inverter circuit; and the circuit board 200 that has the through hole 260 in which the first circuit body 110 and the second circuit body 120 are disposed, and has the intermediate board 210 between the first circuit body 110 and the second circuit body 120, wherein the intermediate board 210 has an AC wiring pattern 240 for transmitting the AC current, and the first circuit body 110 and the second circuit body 120 are connected to the AC wiring pattern 240 in a state where the first circuit body 110 and the second circuit body 120 are in face contact with the AC wiring pattern 240. With such a configuration, it is possible to realize the downsizing and the reduction of a current loss of the power semiconductor device.

The present invention is not limited to the above-described embodiments, and other configurations conceivable within the scope of the technical concept of the present invention are also embraced within the scope of the present invention provided that the technical features of the present invention are not impaired. Further, the present invention also embrace the combinations of the above-described embodiment and a plurality of modifications.

REFERENCE SIGNS LIST 100, 100U, 100V, 100W power semiconductor device
110 first circuit body
120 second circuit body
130 diode
140 transistor
140C collector-side lead frame
140E emitter-side lead frame
150 solder
200 circuit board
201 first circuit board
202 second circuit board
210 intermediate board
220, 230 DC wiring pattern
221 positive terminal
231 negative terminal
240 AC wiring pattern
241 AC terminal
250 control wiring pattern area
251 lead wire
260 through hole
261 first through hole
262 second through hole
300 circuit component
400 sealing member
1000 power conversion device

The invention claimed is:

1. A power semiconductor device comprising:
a first circuit body constituting an upper arm of an inverter circuit for converting a DC current to an AC current;
a second circuit body constituting a lower arm of the inverter circuit; and
a circuit board that has a through hole in which the first circuit body and the second circuit body are disposed, and has an intermediate board between the first circuit body and the second circuit body, wherein
the intermediate board has an AC wiring pattern for transmitting the AC current, and the first circuit body and the second circuit body are connected to the AC wiring pattern in a state where the first circuit body and the second circuit body are in face contact with the AC wiring pattern.

2. The power semiconductor device according to claim 1, wherein
an emitter side of the first circuit body and an emitter side of the second circuit body are disposed on one surface of the circuit board, and
a collector side of the first circuit body and a collector side of the second circuit body are disposed on the other surface of the circuit board.

3. The power semiconductor device according to claim 1, wherein
the circuit board has a DC wiring pattern for transmitting the DC current, and
the first circuit body and the second circuit body are connected with the DC wiring pattern in a state where the first circuit body and the second circuit body are in face contact with the DC wiring pattern.

4. The power semiconductor device according to claim 3, wherein
the first circuit body and the second circuit body each include a diode and a transistor, and
the DC wiring pattern, the diode, the transistor, and a control wiring pattern for the transistor are sequentially arranged along a surface of the circuit board.

5. The power semiconductor device according to claim 3, wherein
the through hole is constituted of a first through hole and a second through hole that are formed independently from each other, the first circuit body is disposed in the first through hole, and the second circuit body is disposed in the second through hole, and the intermediate board having the AC wiring pattern is disposed between the first through hole and the second through hole.

6. The power semiconductor device according to claim 3, wherein
the circuit board includes: a first circuit board on which the DC wiring pattern is disposed; and a second circuit board on which the AC wiring pattern and a control wiring pattern for the first circuit body and the second circuit body are disposed, the first circuit board and the second circuit board being formed as separate bodies.

7. The power semiconductor device according to claim 3, wherein the first circuit body and the second circuit body are sealed by a sealing member.

8. The power semiconductor device according to claim 3, wherein a circuit component is mounted on the circuit board.

9. A power conversion device, wherein arm circuits each constituting a power semiconductor device for one phase by the power semiconductor device according to claim 1 are arranged on the circuit board in parallel to each other for three phases.

* * * * *